United States Patent [19]
Pelta

[11] 4,395,678
[45] Jul. 26, 1983

[54] LINEARIZING CIRCUIT FOR METER DISPLAYS

[75] Inventor: Edmond R. Pelta, Los Altos Hills, Calif.

[73] Assignee: EMC Corporation, Chicago, Ill.

[21] Appl. No.: 178,651

[22] Filed: Aug. 15, 1980

[51] Int. Cl.$^3$ .................... G01R 15/10; G06G 7/12
[52] U.S. Cl. .................................... 324/132; 328/143
[58] Field of Search ............... 324/132, 115; 307/490, 307/503, 491; 328/143, 142; 364/573, 852, 854

[56] References Cited
U.S. PATENT DOCUMENTS

| | | | |
|---|---|---|---|
| 3,644,836 | 2/1972 | Johnson | 328/143 |
| 4,131,846 | 12/1978 | Stone | 324/132 |
| 4,241,303 | 12/1980 | Thompson | 364/573 |

*Primary Examiner*—Ernest F. Karlsen
*Attorney, Agent, or Firm*—H. M. Stanley; R. B. Megley

[57] ABSTRACT

A circuit for linearizing the meter movement of an analog meter provides a correction signal which is effective only in a predetermined portion of the meter movement range and which is adjustable to compensate for the specific linearity error in any given meter. Several of such circuits may be used wherein each of such circuits produces its primary effect in a portion of the meter range which is unaffected by adjustment in any of the other range portions. While the circuit finds its primary utility in providing correction signals to compensate for undesirable characteristics in display devices, analog or digital (with appropriate analog to digital conversion components) it may also be used to compensate for undesirable characteristics in display drive signals where that appears necessary.

17 Claims, 8 Drawing Figures

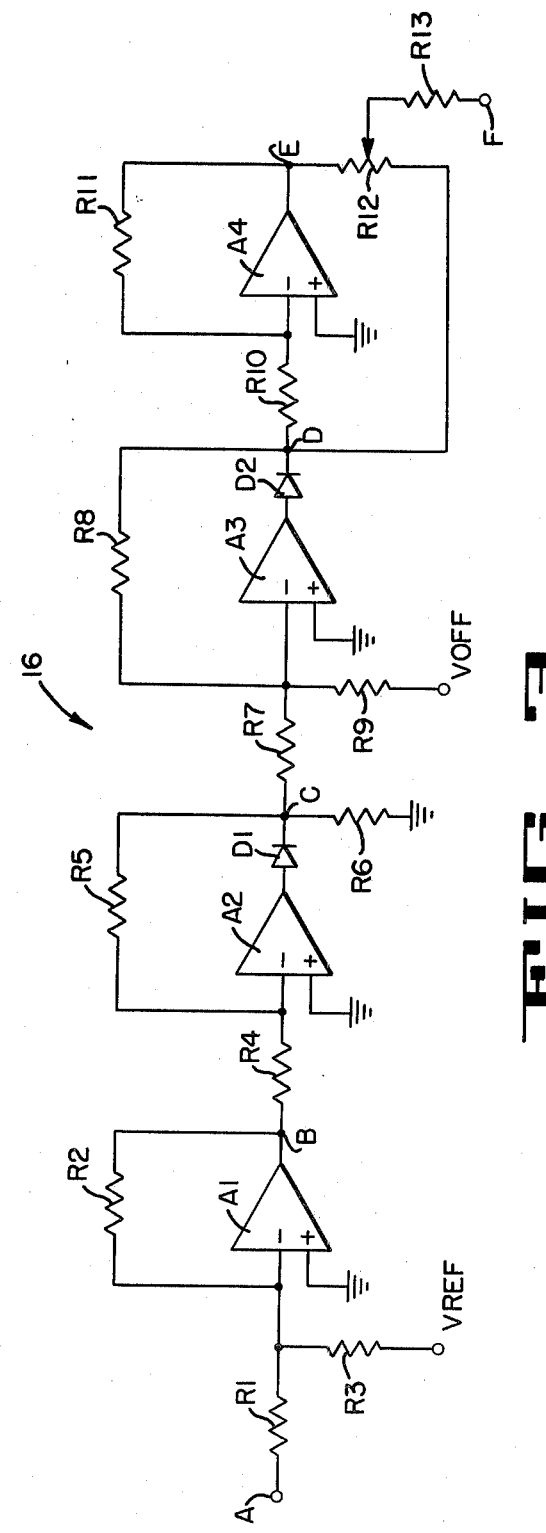
FIG_3
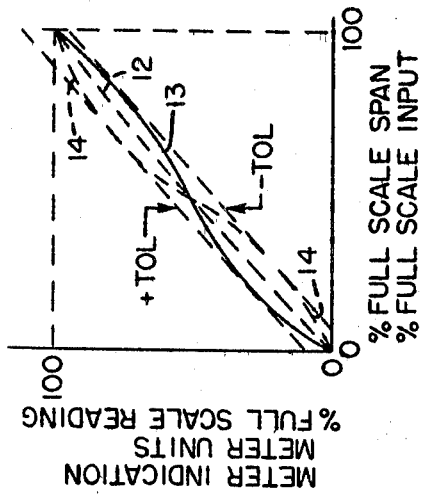
FIG_2
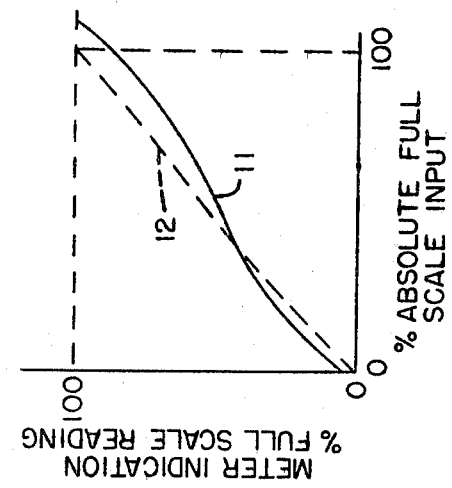
FIG_1

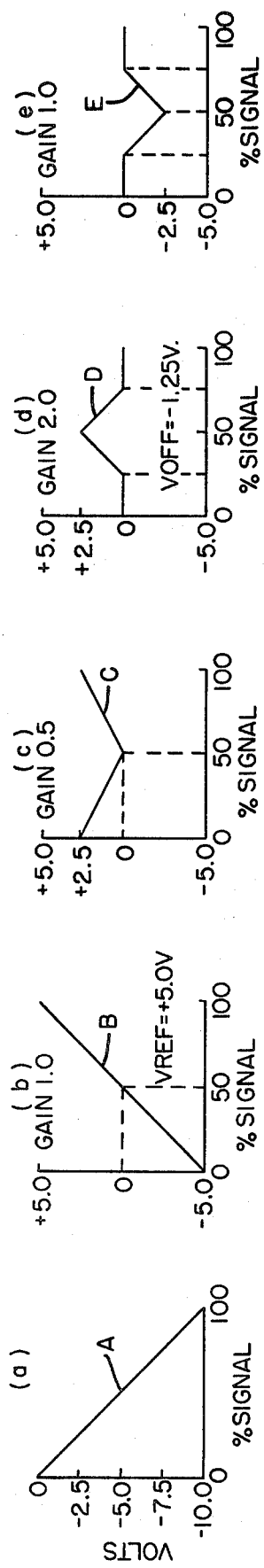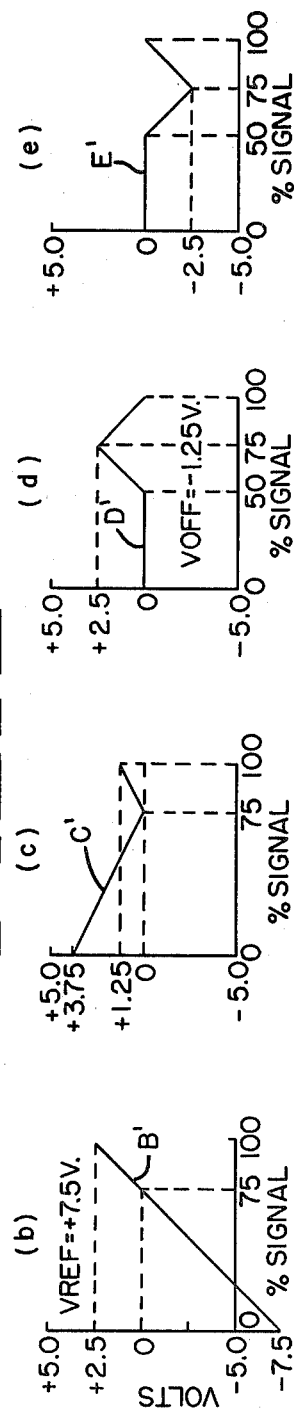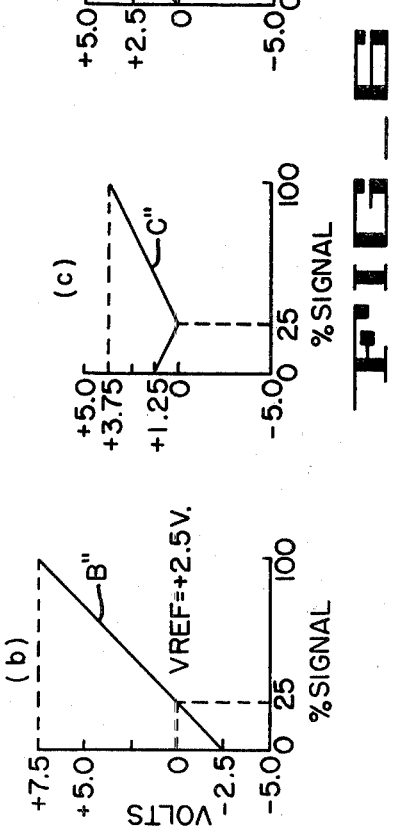

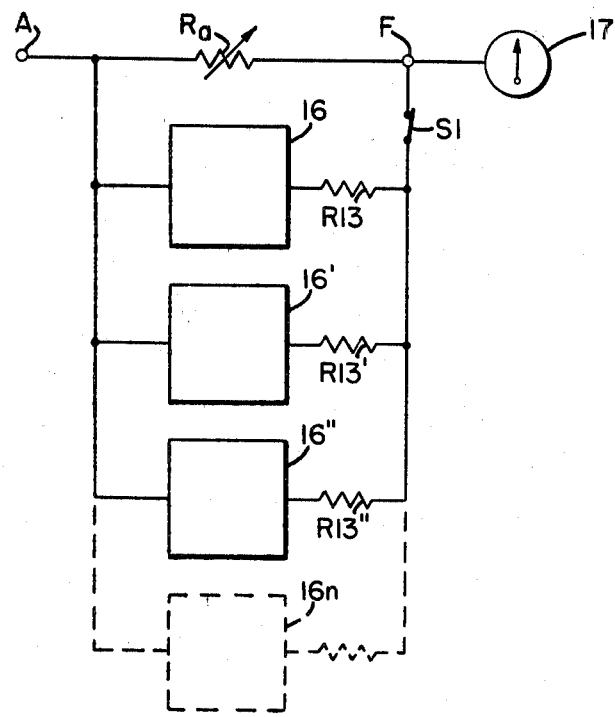
FIG_7
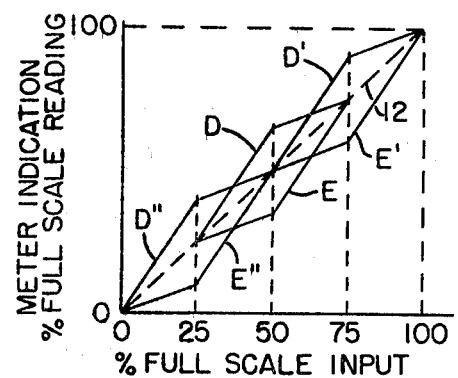
FIG_8

LINEARIZING CIRCUIT FOR METER DISPLAYS

BACKGROUND OF THE INVENTION

1. Field of the Invention

This invention relates to a circuit for use in providing an improved degree of linearity between a meter input and a meter display and more particularly to such a circuit which compensates for specific un-predictable non-linearities which differ from meter to meter.

2. Description of the Prior Art

Analog meter movements have several kinds of basic non-linearity sources which limit meter accuracy. Such meters usually have a driven indicator which deflects from 90° to 120° from zero input to full scale input. Meters of this type are usually manufactured so that the rated full scale deflection angle is obtained by an absolute current which is variable by about plus or minus 5%. This presents no problem since the meter drive is adjustable in most present day meter applications. Since the meter drive current may be varied to obtain full scale meter deflection most plots of meter linearity are based on percent of full scale current rather than on percent of absolute current because, within some narrow range, it is not important what the absolute current is. The meter manufacture also provides a mechanical adjustment to position the meter indicator at zero with zero drive current into the meter input. As a consequence a mechanical adjustment may be made to adjust the zero position of an analog meter and an electrical adjustment may be made to adjust the meter input current to provide for full scale meter indicator deflection when full scale current is being measured.

Another basic source of analog meter movement non-linearity is the magnetic circuit in the common construction of such meters which dictates that the deflection angle of the meter indicator and the current that flows into the meter do not posses a completely linear relationship. However, the non-linearity arising from the current-magnetic circuit relationship is predictable and compensation for such non-linearity may be made by adjusting the plot of the meter scale. There are additional non-linearities which remain which are variable from meter to meter within a given production run of meters. Compensation in advance for these variable non-linearities are not practicable. As a consequence, meters which must operate within a specification recited as two or one percent accuracy require built in adjustments at the manufacturer's facility. A degree of success has been seen by selectively demagnetizing the magnet in the meter movement. In such a case if a two percent accuracy meter is obtained and operated at one quarter scale and if the maximum specified error exists at one quarter scale then the error becomes eight percent of the one quarter scale reading since the two percent specification is in terms of full scale reading. It may therefore be seen that it is relatively difficult to obtain a meter which can indicate values within two percent of the indicated value down into the lower portions of the meter scale.

One meter linearizing scheme is known which uses a circuit containing diodes to provide different slopes in various sections of the meter curve. However, such a scheme causes the upscale range from that portion of the range where the slope is being adjusted to be effected by an adjustment in the lower part of the range. This interaction of the adjustment in an error compensation circuit for use with a meter makes the adjustment over the entire scale difficult and thereby makes the end product meter very expensive.

What has gone before describes the situation where, presuming an ideal input or drive signal, the linearity of a display device, whether it be digital or analog, is less than that desired and where means for correcting the departure from the desired display device character are either only marginally successful or so complex that they are prohibitively expensive. The situation also exists where the character of the input signal, presuming an ideal display device, departs from some desired character whether it be linear or some predetermined non linearity. In such a case current methods and apparatus for providing correcting signals to obtain the desired characteristics in the input signal suffer from the same drawbacks as exist in the case of display device deviations. It may be seen that the two problem areas are closely related and that some means is desirable for obtaining fine adjustments in each case as a supplement to those operations now performed which obtain displayed results in the aforementioned 2% of full scale region.

SUMMARY OF THE INVENTION

The invention disclosed herein provides an electrical circuit which produces a signal in response to a basic input signal when the basic input signal is in a predetermined portion of the basic signal range. The signal which is obtained in response to the basic signal has a substantially zero value outside of the predetermined portion of the basic signal range and the circuit producing such a signal includes a means for receiving both the basic signal and a reference signal and for providing a first output which varies with the basic signal and which has a zero reference which is determined by the reference signal. The signal circuit also includes means for receiving the first output together with an offset signal which provides a second output having a maximum signal amplitude determined by the reference signal and zero amplitude end points of the predetermined portion of the range which are determined by the offset signal. Also included is means for summing a selected portion of the second output with the basic signal so that an adjusted basic signal is obtained only within the portion of the range of variation with which the second output corresponds.

A method of compensating for error in one part of the range of an electrical meter which is adapted to operate in response to an input signal, and wherein the compensation is within one part of the range only and is substantially ineffective in the remaining parts of the range includes the step of combining the input signal with the reference signal and converting the combined signal to a signal corresponding to the input signal and having a zero reference corresponding to the midpoint of the portion of interest of the range. The method includes the formation of a triangular envelope which defines the locus of maxima for the compensation signals and which further defines the ends of the one part of the range by the envelope ends. The method further includes inverting the signal defining the triangular locus, coupling the signals from the triangular locus and the inverted triangular locus to a voltage divider and picking off a selected portion of the voltage divider signal. The method is completed by summing the selected portion of the voltage divider signal with the input signal.

BRIEF DESCRIPTION OF THE DRAWINGS

FIG. 1 is a graphical description of a typical meter indication in percent of full scale as a function of percent of absolute full scale input.

FIG. 2 is a graphical description of meter units of measure as a function of percent full scale span and of meter deflection as percent of full scale input.

FIG. 3 is an electrical schematic of a compensation circuit in accordance with the present invention.

FIG. 4 is a series of signal diagrams for a preferred embodiment of the present invention.

FIG. 5 is another series of signal diagrams for the preferred embodiment of the present invention.

FIG. 6 is yet another series of signal diagrams for the preferred embodiment of the present invention.

FIG. 7 is a block diagram showing the manner in which the circuit of the present invention is used in conjunction with a meter display.

FIG. 8 is a graphical description of a plurality of meter correction signal envelopes as a function of percent of full scale input in a preferred embodiment of the present invention.

DESCRIPTION OF THE PREFERRED EMBODIMENT

FIG. 1 shows a graph with an electrical meter indication on the ordinate and the input to the meter shown on the abcissa. The ordinate, for simplification, is shown in these diagrams as percent of full scale reading where the full scale reading may be an angle through which a needle indicator is caused to sweep in an analog meter or it may be a digital display presenting a digital readout from a zero reading to a character combination representing the highest meter reading of interest. For the purposes of the following explanations the meter indication will be described in terms of angular deflection of a meter needle in an analog meter. The tolerances shown in the graphical depictions of meter characteristics as a function of meter input are drawn with the tolerance envelopes and meter characteristic errors exaggerated for clarity.

The solid line 11 in FIG. 1 shows an uncorrected meter indication plotted with respect to percent of an absolute full scale or design input current prior to any scale corrections being incorporated. The dashed line 12 shows the ideal linearity relationship between the meter indicator deflection and the percent of absolute full scale input. It may be seen that the lower end of the meter output characteristic indicates the meter indicator is displaced from zero for a zero input. In like fashion, in this example, it appears to require a higher input than the ideal design value to obtain a full scale swing of the meter indicator.

The usual mechanical adjustment (not shown), which is not a part of this invention, is utilized to bring the meter output characteristic to the origin as depicted by curve 13 in FIG. 2. An electrical adjustment to the meter drive circuit (not shown), which is also not a part of this invention, may be made to bring the upper end of the meter characteristic curve 13 to a point such that when the meter reads full scale on its face a particular input is applied to the meter which is termed the full scale input. The meter characteristic curve is therefore adjustable to be fixed at zero and at full scale and typically takes the shape of curve 13 of FIG. 2. If all meters of a particular design could be predicted to have the output characteristic of curve 13, then it would be a simple matter to align the meter units on the meter face as a function of full scale span to assume the dashed line curve 14 also seen in FIG. 2. In such a case the error in the usual meter reading would be offset by the intentional error built into the meter scale and the ideal meter characteristic of line 12 in FIG. 2 would be obtained. However, a variable non-linearity which is different from meter to meter within a given production run of meters of the same design exists and there is no reasonable way to compensate for this variable non-linearity in advance. Thus, even with the rearrangement of the meter units on the meter indicator face, the ideal meter characteristic indicated by the line 12 in FIG. 2 is not obtained.

The expense of obtaining meters with accuracies more refined than those depicted by the typical curve 13 of FIG. 2 is considerable. In many instances the application does not warrant the expense while the same type of meter might be used in a different application where the exepnse of obtaining a more accurate meter is well supported. What appears to be needed in obtaining highly accurate instruments (less than 1 or 2 percent of full scale non-linearity) appears to be some means for effecting corrections to the individual non-linearity characteristics of each meter when high reading accuracy is required and eliminating such means when such accuracy is not required. Such a means should have the characteristic of being capable of adjustment to correct the meter characteristic curve during one portion of the full scale excursion of the meter while not effecting the meter reading at points outside that one portion. An appropriate means is represented by a meter correction circuit as described herein. If a number of such circuits were present and could independently effect different portions of the range then each range portion could be served by its own circuit to provide for linearity correction and would have no effect on other portions of the range. A single adjustment could be made for each portion of the full scale range and a very tight tolerance such as one half or one quarter percent of actual reading could be obtained over most of the meter scale. For illustration purposes it will be assumed that the meter correction circuit of the present invention will provide correction signals to be used in three segments of the meter scale; namely one quarter scale plus and minus one quarter scale, one half scale plus and minus one quarter scale and three quarters scale plus and minus one quarter scale. These three portions of the full scale range of a meter may be illustrated by the portion center points which are indicated as lying on the 25%, 50% and 75% of full scale lines seen in FIG. 8.

A circuit for providing a correction signal for one portion of a meter range only is shown in FIG. 3. In this circuit the input which drives a meter is also coupled to the input terminal A. The input signal is coupled through a resistor R1 to an inverting input on an amplifier A1. Also coupled to the inverting input of A1 is a voltage Vref. The purpose of the Vref is to provide a signal level which when summed with the signal through resistor R1 will dictate the output at point B from amplifier A1. The output at B will be zero when there is zero signal at the inverting input which removes the necessity of delivering any signals through the feedback path containing resistor R2. Consequently, the point of zero output at point B may be predetermined by the level Vref and the value of the resistor R3. For example, if R1 equals R3 and the input to terminal A is minus 5 volts, then if Vref is plus 5 volts the output at point B in FIG. 3 will be zero.

The output from amplifier A1 is coupled through resistor R4 to the inverting input on an amplifier A2. There is also a diode D1 at the output of amplifier A2. The circuit surrounding amplifier A2 serves as a rectifier. Negative signals at point B coupled to the inverting input of the amplifier will require a positive output from A2 coupled through diode D1 to point C of the circuit of FIG. 3 so that an appropriate feedback current is maintained through R5 to cause the current summation at the inverting input of A2 to be zero. Positive signals at point B coupled to the inverting input of amplifier A2 will drive the A2 output negative. The negative output is decoupled from point C by diode D1. However, a path from point B to ground through R4, R5 and R6 exists so that point C is one point on a voltage divider. Therefore if a positive input exists at point B, a positive signal which is less than the signal at point B will appear at point C on the voltage divider. Thus, a positive output is seen at point C for both positive and negative inputs A2.

An offset voltage, Voff, is coupled to the input of an amplifier A3 through a resistor R9. The rectified signal at point C is also coupled to the inverting input of A3 through a resistor R7. Voff is set at a negative level in this embodiment to adjust the output at point D in accordance with the Voff level. For example, if R7 equals R9 and the voltage at point C is plus 2.5 volts and Voff is minus 1.25 volts, then the output at amplifier A3 would normally be negative to provide the proper current sense through the feedback resistor R8 to maintain a substantially zero current summation at the inverting input of A3. However, the output of A3 is decoupled from the feedback path and point D for negative going amplifier outputs by diode D2. Point D will therefore be at zero volts (reference) for all signal levels at point C which when summed with Voff provide negative amplifier output. On the other hand when the sum of Voff and the signal level at point C in FIG. 3 is such as to require a current to flow from the A3 output to the inverting input of the amplifier, the amplifier output is positive and is coupled to point D and the feedback path through R8. Therefore only positive outputs appear at point D.

The output at point D is inverted by amplifier A4 and present at point E. The gain of A4 is set by the ratio of the resistors R11 to R10 to be unity so that the signal at point E is at the same level as the signal at point D, but is of opposite polarity. The signals at points D and E are coupled to opposite ends of a potentiometer R12 as seen in FIG. 3 so that any value between the signal level at point E and the signal level at point D may be picked off of the potentiometer by adjustment of the position of the potentiometer wiper. The signal obtained through such adjustment is provided at terminal F in FIG. 3.

Thus, the circuit of FIG. 3 provides an initial comparison stage for the purpose of setting the zero output location from amplifier A1 in accordance with the voltage level Vref. The second stage of the circuit of FIG. 3 is a rectifier providing a positive polarity signal at point C either through amplifier A2 or through the voltage divider R4, R5, R6. The third stage of the circuit of FIG. 3 adjusts the level of the rectified output in accordance with the stage gain and deletes all output at point D when the input condition Ec/R7>Voff/R9 is met where Ec is the signal level at point C. The output envelope at point D therefore describes a locus which is triangular in shape having a center point or maximum signal magnitude point in the full scale range of the meter as determined by Vref and having end points or zero signal points as determined by Voff (FIG. 4(d)).

For purposes of clarifying the foregoing an example will be described using illustrative values so that the signal treatment may be easily followed. In FIG. 4(a) a voltage level at the input terminal A of FIG. 3 is shown on the ordinate which may vary between zero and minus 10 volts. The negative input signal is used here for convenience although the circuit could have been arranged to accept a positive going input signal. The voltage level at terminal A indicated in FIG. 4(a) provides the corresponding percent of total signal output as shown by the curve A in the Figure. If R1 is equal to R3 and plus 5 volts is applied as Vref, the signal at point B in FIG. 3 may be seen in FIG. 4(b) as curve B. The gain of A1 is set at unity in this example by making R2 equal to R1. If a zero signal is applied to terminal A, the plus 5 volt Vref level will provide a minus 5 volt output at point B of FIG. 3. In like fashion if the level at terminal A is minus 5 volts there will be zero output at point B as seen in FIG. 4(b). When the voltage at terminal A is minus 10 volts, unity gain and inversion will provide a plus 5 volt level at amplifier A1 output. The curve B as seen in FIG. 4(b) results as the input excursion at terminal A goes from the minimum (zero) to the maximum (minus 10 volts).

The gain of the amplifier A2 is set at one half by making resistor R5 one half the value of resistor R4. Resistor R6 from point C to ground in FIG. 3 is set at a value which is equal to the sum of the resistances R5 and R4. It may thus be seen that if a voltage level is present at point B, the sum of R4 and R5 being equal to R6, then one half that voltage level will appear at point C. However, part of the voltage divider (R5) serves in a feedback path for the amplifier A2 and another part of the voltage divider (R4) serves as the amplifier input resistor. Since the signal at point B is coupled through the input resistor to the inverting input of amplifier A2, any positive signal at point B will tend to cause the output of amplifier A2 to go negative. Diode D1 prevents the output at point C from going negative and therefore positive signals at B are divided to one half their value at point C. If the signal at point B is negative then the output of the amplifier A2 is positive and the output at point C is one half of the signal level at point B by virtue of the one half gain set by the resistors R5 and R4 for the amplifier A2. Thus, a signal whether it be positive or negative provides a positive output at point C which is one half of the signal level of point B. This may be seen in FIG. 4(c) where the signal at point C is described by the locus of output points C which varies from plus 2.5 volts at zero signal input to zero at half signal input and to plus 2.5 volts again at 100 percent of the signal input. The level Vref determines the percent of full signal at which the low point of the curve of FIG. 4(c) occurs, because it determines the zero level in the locus of points B in FIG. 4(b).

Still referring to FIG. 3, Voff is coupled to the inverting input of amplifier A3 through a resistor R9. The signal at point C in FIG. 3 is also coupled to the inverting input of amplifier A3 through a resistor R7. The gain of amplifier A3 is set at two by choosing resistor R8 to be twice the magnitude of resistor R7. This is done to amplify the signal back to its level at point B since it was necessary to accept less than unity gain through the R4, R5, R6 voltage divider in the previous stage. Voff is selected in this example as minus 1.25 volts which serves to delete all signals at the point D where Ec/R7>Voff/R9 as hereinbefore described. When this occurs it may be seen that the zero crossing points for the curve D will occur at 25 percent and 75 percent of full scale signal (FIG. 4(d)). The remainder of curve D which extends below 25 percent signal and above 75 percent of the basic signal, shows a net zero signal. Signals at point C which meet the condition Ec/R7>Voff/R9 therefore provide substantially zero output from amplifier A3 at point D. Signals which do not meet this condition on the other hand are amplified in accordance with the ratio of R8 to R7 (which is 2 in this case) and are inverted to provide the locus of signal points D shown in FIG. 4(d). This signal is coupled to one end of a linear potentiometer R12 as shown in FIG. 3.

The signal at point D is also coupled to the inverting input of unity gain amplifier A4 to provide the locus of signal points shown in FIG. 4(e) at point E. The signal at point E is coupled to the opposite end of the linear potentiometer so that an envelope of signals bounded in the positive region by the curve D and in the negative region by the curve E is available at terminal F by positioning the wiper on potentiometer 12. For example if the wiper is positioned at the end of the potentiometer corresponding to terminal E then the signals at terminal F would describe the locus of FIG. 4(e) as the input signal made an excursion through the entire zero to minus 10 volt range. In like fashion the signal at terminal F would describe the locus of FIG. 4(d) if the wiper of the potentiometer R12 was positioned at the D terminal end of the potentiometer. Intermediate these two loci the level and polarity of the signal at terminal F may be selected by appropriate positioning of the potentiometer wiper.

As seen in FIG. 7, the circuit of FIG. 3 may be used with any analog meter 17 to effect adjustment in several predetermined portions of the meter range. There is no requirement that the portions of the range be equal in size nor is there any requirement that every portion of the meter range be provided with a correction circuit 16. These requirements are completely dependent upon the characteristics of the meter 17 and on the degree of accuracy which is ultimately desired. For example, a large number, n, of correction circuits may be utilized, each serving a small portion of a meter range for the purpose of bringing that portion of the range very close to the ideal linearity relationship. As hereinbefore described, each of such circuits would require only one adjustment for providing a correction to the corresponding portion of the meter range since adjustments made in circuits serving other portions of the range would have substantially no interaction with previously set correction circuits.

FIG. 7 shows the input terminal A coupled to drive the meter 17 through a full scale correction adjustment resistance Ra. The input terminal A is also connected to the input of each of a number of correction circuits shown as 16, 16', 16" and 16n to demonstrate the utility of the correction circuit in as many range portions as desired. For the purposes of this disclosure, reference is made only to the correction circuits 16, 16' and 16". The function of the circuit 16 has been described hereinbefore in conjunction with FIG. 4 wherein a correction signal is provided which is effective only between 25 and 75 percent of full scale signal. With the input of FIG. 4(a) applied to the input terminal of the circuit 16' of FIG. 7, reference is made to FIG. 5 where the reference letters B', C', D' and E' correspond to signals at circuit points B, C, D and E in a circuit similar to that of FIG. 3. Vref in the circuit 16' is set to plus 7.5 volts in this example which provides the locus of points B' seen in FIG. 5(b) at the output of the amplifier A1. The zero reference point at point B' in the circuit 16' occurs when the input voltage is minus 7.5. This is seen to be at 75 percent of full scale input signal and the total swing in 10 volts extending from minus 7.5 volts to plus 2.5 volts by virtue of the unity gain of amplifier A1. Zero signal input with plus 7.5 volt Vref places the plus 7.5 volts at the input of amplifier A1 and produces a minus 7.5 volt output at point B'. In like fashion a minus 10 volt input together with the plus 7.5 volt Vref produces a minus 2.5 volt input which is inverted to a plus 2.5 volt signal level at point B'.

The signal of FIG. 5(b) is treated by the 0.5 gain stage of amplifier A2 to provide the locus of points C' of FIG. 5(c). All signals being inverted or folded around zero by the amplifier A2 diode D1 combination and the voltage divider R4, R5, R6, the signal at point C' ranges from plus 3.75 volts at zero signal input to zero volts at 75% full scale signal to plus 1.25 volts at 100% full scale signal. This is accomplished as hereinbefore described through the amplifier A2 from zero to 75% of full scale and through the aforementioned voltage divider from 75% to 100% of full scale.

Voff is again set at minus 1.25 volts and the gain of amplifier A3 is two as described for correction circuit 16. The locus of correction signals at point D' in circuit 16' is therefore seen in FIG. 5(d) as zero from zero to 50% of full scale signal where the signal level at point C' is greater than Voff and as describing the inverted "V" path D' from 50% to 100% of full scale signal. As described in conjunction with FIG. 4 hereinbefore, the 75% full scale centerpoint is determined by the level of Vref and the 50% and 100% zero levels at each end of the envelope defined by the locus D' is determined by Voff.

FIG. 5(e) shows locus E' which is merely the inverse of D'. Both loci D' and E' serve to define the correction signal appearing at terminal F which is effective between 50% and 100% of full scale signal.

FIG. 6 shows the excursion of signal at points B", C", D" and E" in a circuit similar to FIG. 3 and corresponding to points B, C, D and E of FIG. 3 respectively. Once again the input signal of FIG. 4(a) is provided to the circuit 16" of FIG. 7 and Vref in this instance is plus 2.5 volts. With zero signal input the plus 2.5 volt signal appears as minus 2.5 volts at point B". With minus 2.5 volts B" assumes a zero level at 25% full scale signal. When minus 10 volts is present at the input to circuit 16" a net minus 7.5 volts is present at the input to amplifier A1 providing plus 7.5 volts at point B" for 100% full scale signal.

FIG. 6(c) shows the signal at point C" in circuit 16" of FIG. 7 wherein the signal at point B" is rectified by the amplifier A2 and diode D1 combination together with the voltage divider R4, R5, and R6. With a minus 2.5 volt input to this portion of the circuit having a gain of 0.5, a plus 1.25 volt output is seen on the locus of signal points C" of FIG. 6(c). With zero input to the amplifier A2, the output at C" may be seen to be zero at 25% full scale signal. With plus 7.5 volt signal level at point B" the voltage divider provides for a plus 3.75 level at C" at 100% full scale signal as the negative going output of amplifier A2 is decoupled from point C" by the diode D1. With Voff set at minus 1.25 volts in the circuit of 16" a signal at C" of plus 1.25 volts provides a zero level output from A3. The signal at D" is therefore zero at 0% full scale signal. The signal at D" peaks at plus 2.5 volts at 25% full scale due to the gain of two in the amplifying stage A3. With the signal at C" returning once again to plus 1.25 volts at 50% full scale the signal D" returns to zero. For all levels at C" above plus 1.25 volts the condition Ec/R7>Voff/R9 is satisfied as discussed previously thereby producing zero output from the circuit 16" from 50% to 100% full scale signal. The locus of points E" in FIG. 6(e), as described hereinbefore for circuits 16 and 16', is obtained by merely inverting the signal at D" through a unity gain amplification stage having its output at point E". It may once again be seen that the location of the peak for the correction signal envelope defined by curves D" and E" is determined by Vref and the extent of the range of the correction envelope in percent full scale signal is determined by Voff.

The three correction signal envelopes are shown superimposed upon the ideal linearity curve 12 in FIG. 8. The portion of full scale signal which is served by the correction signal within the envelope defined by the curves D and E (FIG. 12) is seen to extend from 25% to 75% of full scale and to be centered about 50% full scale. This may be seen to be in agreement with the curves shown in FIGS. 4(d) and (e). In similar fashion the curves D' and E' serve that portion of full scale extending from 50 to 100% having greatest effect at 75% full scale and the curves D" and E" define a correction signal envelope which serves that portion of the scale extending from zero to 50% having major effect at 25% full scale. The meter may therefore be adjusted at 25%, 50% and 75% full scale independently without causing any interaction at those points with any of the other correction signal generation circuits typified in FIG. 3.

The foregoing description has been explained primarily with reference to analog meters. It should be understood that while most digital meters have a contained correction circuit, the circuit described herein could be utilized with appropriate analog to digital conversion to provide meter reading compensation for digital meters as well. Moreover, if any portion of the correction circuits should fail in an open condition, the meter being served with a correction signal would merely revert to its precorrection accuracy in that portion of the scale formerly being served by the failed circuit. If it is desirable to return the meter to its original uncorrected accuracy, for example, plus and minus 2% of full scale, it is only necessary to open the circuit by some means such as a switch S1 seen in FIG. 7 and the meter will revert to its normal precorrected accuracy characteristic.

If the correction circuit described herein suffers catastrophic failure the meter assumes an unpredictable but small additional error. For many applications it may be desirable to detect and produce an alarm for such a condition. The most common type of failure seen in circuits similar to that of FIG. 3 results in one of the operational amplifier outputs assuming the high or low power supply level. Such a signal level could be used to trigger an audio or visual alarm circuit. This is practical because the amplifier output swings are normally held to levels less than the supply levels.

Although the best mode contemplated for carrying out the present invention has been herein shown and described, it will be apparent that modification and a variation may be made without departing from what is regarded to be the subject matter of this invention.

What is claimed is:

1. An electrical circuit for providing a correction signal in response to a basic signal only when the basic signal is in a predetermined portion of and is defined between opposing end points within a range over which the basic signal varies between a minimum and a maximum value, the correction signal having a substantially zero value at and outside of the end points of the predetermined portion of the range, comprising means for receiving the basic signal and a reference signal and for providing a first output which is a function of the basic signal and which has a zero reference determined by said reference signal, means for receiving said first output and an offset signal and for providing a second output having a maximum signal magnitude determined by said reference signal and wherein the end points of the predetermined portion of the range are determined by said offset signal, and means for summing a selected portion of said second output with the basic signal whereby an adjusted basic signal is obtained only within the predetermined portion of the range of variation.

2. An electrical circuit as in claim 1 wherein said second output is bipolar whereby the adjusted basic signal may be increased or decreased in value relative to the basic signal.

3. An electrical circuit as in claim 1 wherein said means for receiving the basic signal and a reference signal comprises a comparator and wherein said first output is of one polarity for basic signals below said reference and of the opposite polarity for basic signals above said reference.

4. An electrical circuit as in claim 1 wherein said means for receiving said first output and an offset signal comprises a rectifier operating to modify said first output to assume only one polarity relative to said zero reference, and a signal level adjusting circuit operating to delete said modified first output when said output exceeds a magnitude determined in accordance with said offset signal.

5. An electrical circuit as in claim 4 wherein said means for providing a second output comprises an inverter coupled to receive said modified first output and providing an inverted modified first output and wherein said means for summing comprises a potentiometer having one side connected to said inverted output and the other side connected to said modified first output, whereby the potentiometer output is adjustable to provide any portion of said second output.

6. An electrical circuit as in claim 1 wherein said means for summing comprises a potentiometer coupled to said second output whereby said potentiometer output provides a selected portion of said second output.

7. An electrical circuit for providing a correction signal to be superimposed on a basic signal to be corrected, wherein the correction signal has substantially no effect on the basic signal outside of the range included between two basic signal boundary values, comprising means for defining the center of the correction signal range relative to the basic signal range, means for shaping a correction signal envelope and for defining the two basic signal boundary values, one at each end of the correction signal range, and means for summing a selected portion of the correction signal magnitude with the basic signal to offset basic signal error only for basic signal values within the basic signal boundaries defining the correction signal range.

8. An electrical circuit as in claim 7 wherein said means for comparing comprises an operational amplifier coupled to receive both the basic signal and said reference signal and providing a comparator output which is a function of the basic signal and which has a zero level as determined by said reference signal, said means for shaping comprising a rectifier and an offset amplifier providing a first signal defining one side of said correction signal envelope, and an inverter coupled to said first signal providing a second signal defining the other side of said correction signal envelope.

9. An electrical circuit as in claim 7 wherein said means for summing includes a potentiometer having a signal corresponding to one side of said correction signal envelope connected to one input and a signal corresponding to the other side of said correction signal envelope connected to another input, so that a signal corresponding to said selected portion is provided at said potentiometer output.

10. Apparatus for providing a correction signal to be effective in one portion only of the range of an input signal for an electrical meter comprising
a first circuit receiving the input signal and a reference signal and providing a first circuit output corresponding to the input signal,
a second circuit receiving said first circuit output and an offset signal and providing a second circuit output having zero correction signal points at each end of the one range portion which are determined by said offset signal and having a maximum correction signal point between said zero correction signal points having a location in the range of the input signal which is determined by said reference signal,
means for inverting said second circuit output
and means for combining said second circuit and inverted second circuit outputs and for summing a selected part of said combined outputs with the meter input signal.

11. Apparatus as in claim 10 wherein said first and second circuits comprise analog circuits and wherein the electrical meter is an analog meter adapted to receive said summed selected part of said combined output and said input signal, whereby the meter reading error may be reduced within the one range portion.

12. Apparatus as in claim 10 wherein the electrical meter is a digital meter and wherein said first and second circuits comprise analog circuits, together with an analog to digital converter coupled to receive said summed selected part of said combined output and said input signal whereby the meter reading error may be reduced within the one range portion.

13. A method of compensating for error in one part of the range of an electrical meter adapted to operate in response to an input signal within the range between zero and a maximum input signal value, wherein compensation within the one part of the range is substantially ineffective in the remaining parts of the range, comprising the steps of
combining the input signal with a reference signal and converting the combined signal to a signal corresponding to the input signal and having a zero reference corresponding to the mid point of the one part of the range,
forming a signal envelope defining the locus of maxima for the compensation signals and defining the ends of the one part of the range at the envelope ends,
inverting the signal envelope defining the locus of maxima,
coupling the signals defined by the locus of maxima and the inverted signal envelope to separate points on a voltage divider,
picking off a selected portion of the signal across the voltage divider, and
summing the selected portion with the input signal.

14. The method of claim 13 wherein the step of forming a signal envelope comprises
rectifying the converted signal so that it is folded about the zero reference, and
deleting the rectified signal in accordance with a predetermined offset signal when the rectified signal exceeds a magnitude determined by the offset signal.

15. An electrical circuit for providing a supplemental signal in response to a basic signal which may vary over a signal range, wherein the supplemental signal is non-zero only over a predetermined limited portion and is substantially zero outside of the limited portion of the range of the basic signal, the limited portion being defined between upper and lower end points within the basic signal range, comprising
means for receiving both the basic signal and a reference signal and for providing a modified basic signal having a zero reference determined by said reference signal,
means for rectifying said modified basic signal with respect to said new zero reference,
and means for receiving both said rectified signal and an offset signal and for providing the supplemental signal which is non-zero only over a predetermined limited portion of the signal range and is zero outside of the predetermined limited portion of the signal range, and wherein the end points of the predetermined limited portion are determined by said offset signal.

16. An electrical circuit as in claim 15 together with means for summing a selected portion of the supplemental signal with the basic signal whereby an adjusted basic signal is provided only within the limited portion of the basic signal range.

17. An electrical circuit as in claim 16 wherein the supplemental signal is bipolar, whereby said adjusted basic signal may be larger or smaller in value than the basic signal.

* * * * *

UNITED STATES PATENT AND TRADEMARK OFFICE
CERTIFICATE OF CORRECTION

PATENT NO.  : 4,395,678
DATED       : July 26, 1983
INVENTOR(S) : EDMOND R. PELTA It is certified that error appears in the above-identified patent and that said Letters Patent is hereby corrected as shown below:

On the Title page in item [73] assignee:
    "EMC Corporation, Chicago, Ill." should read
    --FMC Corporation, Chicago, Ill.--

Signed and Sealed this

*First* Day of *November 1983*

[SEAL]

*Attest:*

*Attesting Officer*

GERALD J. MOSSINGHOFF

*Commissioner of Patents and Trademarks*